United States Patent
Sudo et al.

(10) Patent No.: US 9,831,270 B2
(45) Date of Patent: Nov. 28, 2017

(54) NONVOLATILE SEMICONDUCTOR MEMORY DEVICE AND METHOD FOR MANUFACTURING THE SAME

(71) Applicant: KABUSHIKI KAISHA TOSHIBA, Tokyo (JP)

(72) Inventors: Gaku Sudo, Mie (JP); Yumiko Miyano, Tokyo (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/460,438

(22) Filed: Mar. 16, 2017

(65) Prior Publication Data

US 2017/0271366 A1  Sep. 21, 2017

(30) Foreign Application Priority Data

Mar. 16, 2016 (JP) .................. 2016-052690

(51) Int. Cl.

| | |
|---|---|
| *H01L 27/11582* | (2017.01) |
| *H01L 23/528* | (2006.01) |
| *H01L 27/11556* | (2017.01) |
| *H01L 21/311* | (2006.01) |
| *H01L 21/3213* | (2006.01) |
| *H01L 21/768* | (2006.01) |
| *H01L 21/28* | (2006.01) |

(Continued)

(52) U.S. Cl.
CPC .. *H01L 27/11582* (2013.01); *H01L 21/28273* (2013.01); *H01L 21/28282* (2013.01); *H01L 21/31111* (2013.01); *H01L 21/32133* (2013.01); *H01L 21/76802* (2013.01); *H01L 21/76877* (2013.01); *H01L 23/528* (2013.01); *H01L 27/11519* (2013.01); *H01L 27/11556* (2013.01); *H01L 27/11565* (2013.01)

(58) Field of Classification Search
CPC ......... H01L 27/11582; H01L 27/11556; H01L 21/28273; H01L 21/28282; H01L 21/31111; H01L 21/32133; H01L 21/76802; H01L 21/76877; H01L 23/528; H01L 27/11519; H01L 27/11565
See application file for complete search history.

(56) References Cited

U.S. PATENT DOCUMENTS

| | | |
|---|---|---|
| 2003/0024731 A1 | 2/2003 | Nordal et al. |
| 2007/0252201 A1 | 11/2007 | Kito et al. |

(Continued)

*Primary Examiner* — Walter H Swanson
(74) *Attorney, Agent, or Firm* — Finnegan, Henderson, Farabow, Garrett & Dunner, L.L.P.

(57) ABSTRACT

According to one embodiment, a nonvolatile semiconductor memory device includes first and second connectors, first and second conductive layers, a first insulating region, and a memory portion. The first connector extends in a first direction. The first conductive layer is electrically connected to the first connector, and includes a first planar region, a first overlap region, a first side surface region, and a first crossing side surface region. The second connector extends in the first direction. The second conductive layer is electrically connected to the second connector, and includes a second planar region, a second overlap region, a second side surface region, and a second crossing side surface region. The first insulating region is provided between the first and second conductive layers. The memory portion is connected to the first and second planar regions.

12 Claims, 9 Drawing Sheets

(51) Int. Cl.
*H01L 27/11519* (2017.01)
*H01L 27/11565* (2017.01)

(56) References Cited

U.S. PATENT DOCUMENTS

| | | |
|---|---|---|
| 2011/0001182 A1 | 1/2011 | Sato |
| 2011/0108907 A1 | 5/2011 | Maeda |
| 2014/0027838 A1 | 1/2014 | Kido et al. |
| 2015/0318298 A1* | 11/2015 | Matsudaira ......... H01L 27/1157 |
| | | 257/314 |

* cited by examiner

NONVOLATILE SEMICONDUCTOR MEMORY DEVICE AND METHOD FOR MANUFACTURING THE SAME

CROSS-REFERENCE TO RELATED APPLICATIONS

This application is based upon and claims the benefit of priority from Japanese Patent Application No. 2016-052690, filed on Mar. 16, 2016; the entire contents of which are incorporated herein by reference.

FIELD

Embodiments described herein relate generally to a nonvolatile semiconductor memory device and a method for manufacturing the same.

BACKGROUND

In a nonvolatile semiconductor memory device, a conductive film of a memory portion is electrically connected to an interconnect or the like in a connection region.

DETAILED DESCRIPTION

Figure 1A:
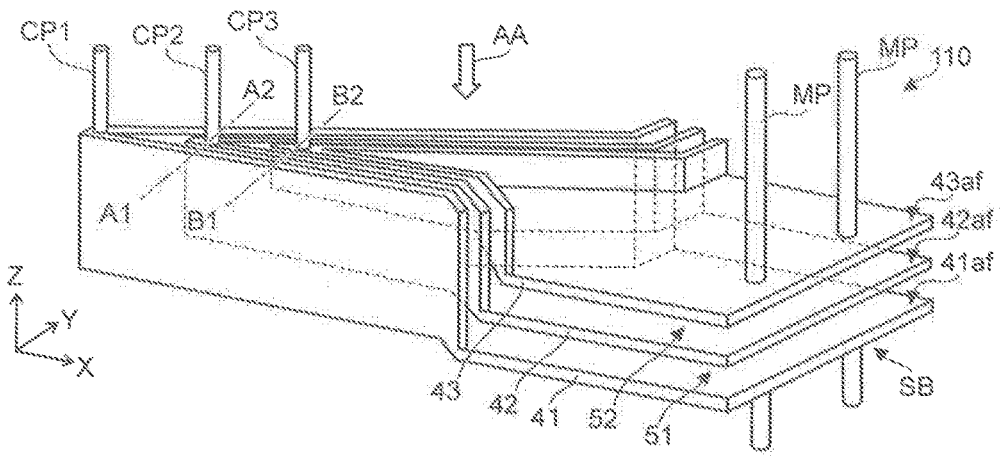
FIG. 1A and FIG. 1B are schematic perspective views illustrating a nonvolatile semiconductor memory device according to a first embodiment.

According to one embodiment, a nonvolatile semiconductor memory device includes first and second connectors, first and second conductive layers, a first insulating region, and a memory portion. The first connector extends in a first direction. The first conductive layer is electrically connected to the first connector. The first conductive layer includes a first planar region, a first overlap region, a first side surface region, and a first crossing side surface region. The first planar region spreads to cross the first direction. The first overlap region overlaps the first connector in the first direction and is continuous with the first planar region. The first side surface region extends along the first planar region and is continuous with the first planar region and the first overlap region. The first side surface region includes a first side surface extension end portion and a first side surface middle portion. The first side surface middle portion is positioned between the first side surface extension end portion and the first overlap region. The first crossing side surface region extends along the first planar region and is continuous with the first planar region and the first overlap region. The first crossing side surface region includes a first crossing side surface extension end portion and a first crossing side surface middle portion. The first crossing side surface middle portion is positioned between the first crossing side surface extension end portion and the first overlap region. A distance between the first side surface extension end portion and the first crossing side surface extension end portion is longer than a distance between the first side surface middle portion and the first crossing side surface middle portion. The second connector extends in the first direction. The second conductive layer is electrically connected to the second connector. The second conductive layer includes a second planar region, a second overlap region, a second side surface region, and a second crossing side surface region. The second planar region spreads along the first planar region. The second overlap region overlaps the second connector in the first direction and is continuous with the second planar region. At least a portion of the second overlap region is disposed between the second connector and the first planar region. The second side surface region is continuous with the second planar region and the second overlap region and is aligned with an extension direction of the first side surface region. The second side surface region includes a second side surface extension end portion and a second side surface middle portion. The second side surface middle portion is positioned between the second side surface extension end portion and the second overlap region. The second crossing side surface region is continuous with the second planar region and the second overlap region and is aligned with an extension direction of the first crossing side surface region. The second crossing side surface region includes a second crossing side surface extension end portion and a second crossing side surface middle portion. The second crossing side surface middle portion is positioned between the second crossing side surface extension end portion and the second overlap region. A distance between the second side surface extension end portion and the second crossing side surface extension end portion is longer than a distance between the second side surface middle portion and the second crossing side surface middle portion. The first insulating region is provided between the first conductive layer and the second conductive layer. The memory portion is connected to the first planar region and the second planar region.

According to another embodiment, a method for manufacturing a nonvolatile semiconductor memory device is disclosed. The method can include forming a stacked body by alternately stacking a conductive film and an insulating film inside a recess of a base body. The recess has a bottom surface, a first side surface, and a second side surface. A distance between the first side surface and the second side surface changes. The stacked body includes a plurality of the conductive films and a plurality of the insulating films. The method can include removing a portion of the stacked body to expose a portion of a first conductive film of the plurality of conductive films, expose a portion of a second conductive film of the plurality of conductive films, form a first conductive layer from the first conductive film, and form a second conductive layer from the second conductive film. The method can include forming a first connector and a second connector. The first connector extends in a first direction on a first overlap region and is electrically connected to the first overlap region. A first side surface region of the first conductive layer is linked to a first crossing side surface region of the first conductive layer in the first overlap region. The first side surface region is aligned with the first side surface. The first crossing side surface region is aligned with the second side surface. The first direction crosses the bottom surface. The second connector extends in the first direction on a second overlap region and is electrically connected to the second overlap region. A second side surface region of the second conductive layer is linked to a second crossing side surface region of the second conductive layer in the second overlap region. The second side surface region is aligned with the first side surface. The second crossing side surface region is aligned with the second side surface. In addition, the method can include forming a memory portion connected to a first planar region of the first conductive layer and a second planar region of the second conductive layer. The first planar region is aligned with the bottom surface. The second planar region is aligned with the bottom surface.

According to another embodiment, a method for manufacturing a nonvolatile semiconductor memory device is disclosed. The method can include forming a stacked body by alternately stacking a first film and a second film inside a recess of a base body. The recess has a bottom surface, a first side surface, and a second side surface. A distance between the first side surface and the second side surface changes. The stacked body includes a plurality of the first films and a plurality of the second films. The method can include exposing a portion of each of the plurality of first films by removing a portion of the stacked body. The method can include forming a memory portion in a region including portions of the plurality of first films and the plurality of second films aligned with the bottom surface. The method can include forming a plurality of conductive layers by forming a hole in the stacked body, removing the plurality of first films via the hole, and introducing a conductive material to a space formed by the removing. The plurality of conductive layers include the conductive material and include a first conductive layer and a second conductive layer. In addition, the method can include forming a first connector and a second connector. The first connector extends in a first direction on a first overlap region and is electrically connected to the first overlap region. A first side surface region of the first conductive layer is linked to a first crossing side surface region of the first conductive layer in the first overlap region. The first side surface region is aligned with the first side surface. The first crossing side surface region is aligned with the second side surface. The first direction crosses the bottom surface. The second connector extends in the first direction on a second overlap region and is electrically connected to the second overlap region. A second side surface region of the second conductive layer is linked to a second crossing side surface region of the second conductive layer in the second overlap region. The second side surface region is aligned with the first side surface. The second crossing side surface region is aligned with the second side surface.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 1B:
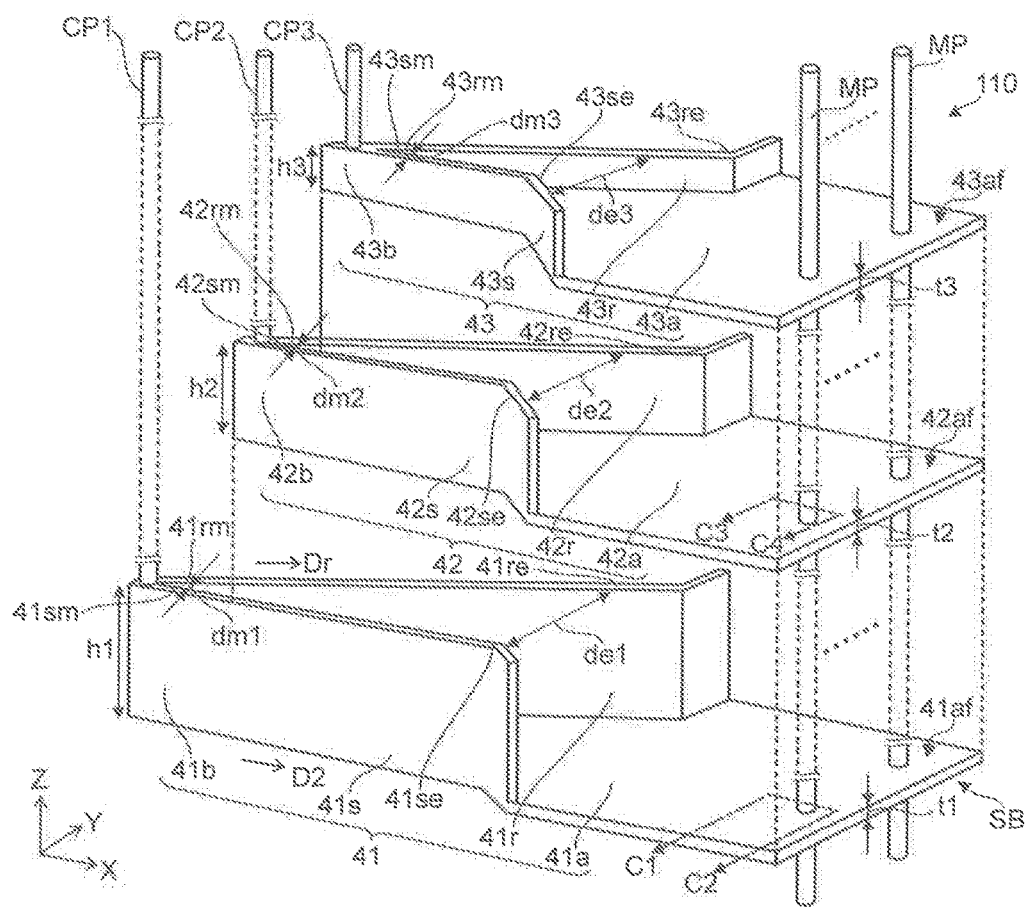

FIG. 1A and FIG. 1B are schematic perspective views illustrating a nonvolatile semiconductor memory device according to a first embodiment.

Figure 2A:
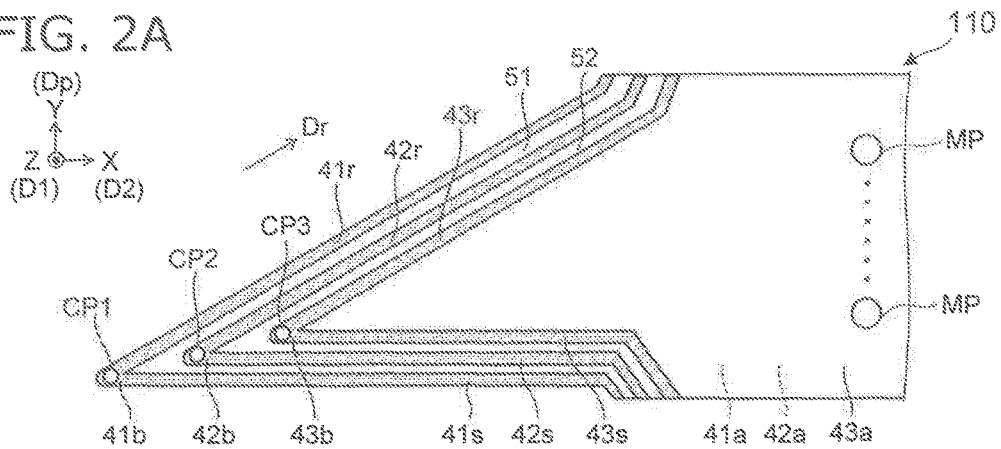
FIG. 2A to FIG. 2F are schematic views illustrating the nonvolatile semiconductor memory device according to the first embodiment.
Figure 2B:
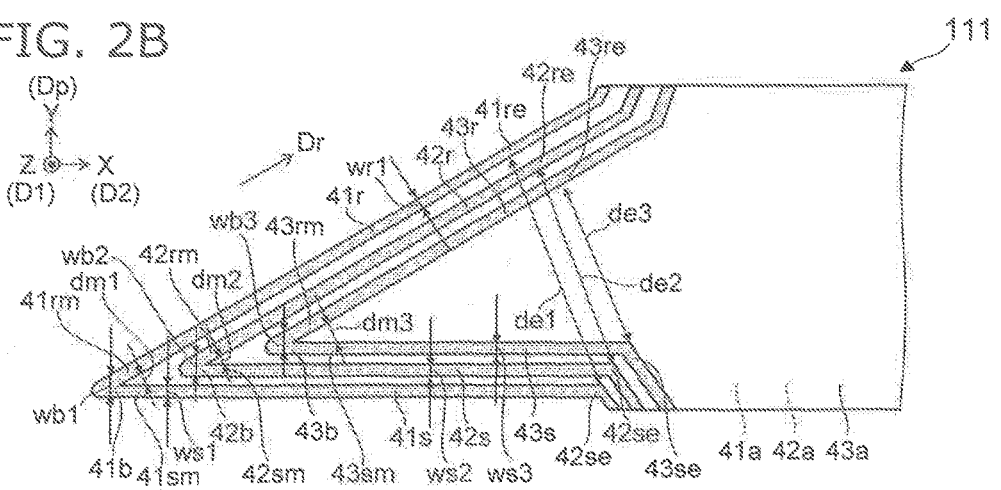
Figures 2C, 2D:
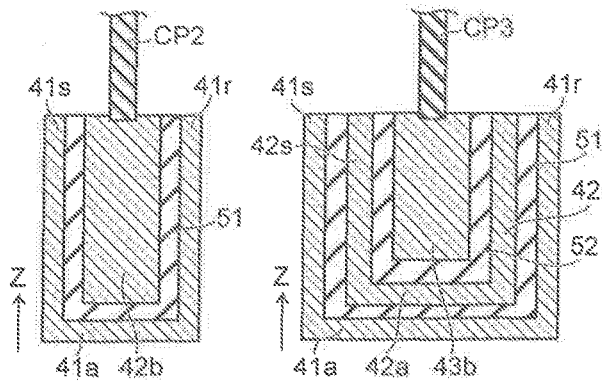
Figure 2E:
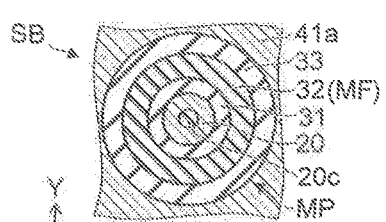
Figure 2F:
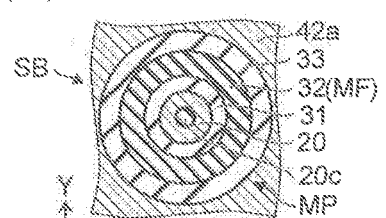

FIG. 2A to FIG. 2F are schematic views illustrating the nonvolatile semiconductor memory device according to the first embodiment, In FIG. 1A and FIG. 1B, the insulating portions are not illustrated for easier viewing of the drawings. In FIG. 1B, multiple components that are included in the nonvolatile semiconductor memory device are shown separated from each other for easier viewing of the drawing. FIG. 2A and FIG. 2B are plan views as viewed from the direction of arrow AA of FIG. 1A. FIG. 2C is a line A1-A2 cross-sectional view of FIG. 1A. FIG. 2D is a line B1-B2 cross-sectional view of FIG. 1A. FIG. 2E is a line C1-C2 cross-sectional view of FIG. 1B. FIG. 2F is a line C3-C4 cross-sectional view of FIG. 1B.

As shown in FIG. 1A and FIG. 2A, the nonvolatile semiconductor memory device 110 according to the embodiment includes a first connector CP1, a second connector CP2, a first conductive layer 41, a second conductive layer 42, a first insulating region 51, and a memory portion MP. A third connector CP3, a third conductive layer 43, and a second insulating region 52 are further provided in the example. The number of these conductive layers is arbitrary. The number of the memory portions MP also is arbitrary.

The first to third connectors CP1 to CP3 extend in a first direction D1.

The first direction D1 is taken as a Z-axis direction. One direction perpendicular to the Z-axis direction is taken as an X-axis direction. A direction perpendicular to the Z-axis direction and the X-axis direction is taken as a Y-axis direction.

The first conductive layer 41 is electrically connected to the first connector CP1. The first conductive layer 41 includes a first planar region 41*a*, a first overlap region 41*b*, a first side surface region 41*s*, and a first crossing side surface region 41*r*.

The first planar region 41*a* spreads to cross the first direction D1 (the Z-axis direction). In the example, the first planar region 41*a* spreads along the X-Y plane. For example, a front surface 41*af* (e.g., the upper surface) of the first planar region 41*a* is substantially parallel to the X-Y plane.

The first overlap region 41*b* is continuous with the first planar region 41*a*. The first overlap region 41*b* overlaps the first connector CP1 in the first direction D1. For example, at least a portion of the first connector CP1 is provided on the first overlap region 41*b*.

As shown in FIG. 1B and FIG. 2B, the first side surface region 41*s* is continuous with the first planar region 41*a* and the first overlap region 41*b*. The first side surface region 41*s* extends along the first planar region 41*a*. For example, the first side surface region 41*s* extends along a second direction D2 from the first overlap region 41b. In the example, the second direction D2 is the X-axis direction.

The first crossing side surface region 41r is continuous with the first planar region 41a and the first overlap region 41b. The first crossing side surface region 41r extends along the first planar region 41a. For example, the first crossing side surface region 41r extends along a direction Dr (an extension direction) from the first overlap region 41b. The direction Dr is, for example, a direction aligned with the X-Y plane. The direction Dr crosses the second direction D2. In the example, the direction Dr is tilted with respect to the second direction D2. In the example, the angle between the second direction D2 (the direction in which the first side surface region 41s extends) and the direction Dr (the direction in which the first crossing side surface region 41r extends) is less than 90 degrees. This angle may be, for example, 70 degrees or less. This angle may be 50 degrees or less.

For example, the distance between the first side surface region 41s and the first crossing side surface region 41r is longer away from the first overlap region 41b.

For example, as shown in FIG. 1B and FIG. 2B, the first side surface region 41s includes a first side surface extension end portion 41se and a first side surface middle portion 41sm. The first side surface middle portion 41sm is positioned between the first side surface extension end portion 41se and the first overlap region 41b. The first side surface extension end portion 41se may not always be at the end of the first side surface region 41s. The distance between the first side surface extension end portion 41se and the first overlap region 41b is longer than the distance between the first side surface middle portion 41sm and the first overlap region 41b.

On the other hand, the first crossing side surface region 41r includes a first crossing side surface extension end portion 41re and a first crossing side surface middle portion 41rm. The first crossing side surface middle portion 41rm is positioned between the first crossing side surface extension end portion 41re and the first overlap region 41b. The first crossing side surface extension end portion 41re may not always be at the end of the first crossing side surface region 41r. The distance between the first crossing side surface extension end portion 41re and the first overlap region 41b is longer than the distance between the first crossing side surface middle portion 41rm and the first overlap region 41b.

In the embodiment, a distance de1 between the first side surface extension end portion 41se and the first crossing side surface extension end portion 41re is longer than a distance dm1 between the first side surface middle portion 41rm and the first crossing side surface middle portion 41rm (referring to FIG. 1B and FIG. 2B).

The second conductive layer 42 is electrically connected to the second connector CP2. The second conductive layer 42 includes a second planar region 42a, a second overlap region 42b, a second side surface region 42s, and a second crossing side surface region 42r.

As shown in FIG. 1B, the second planar region 42a spreads along the first planar region 41a. For example, a front surface 42af (e.g., the upper surface) of the second planar region 42a is substantially parallel to the X-Y plane.

The second overlap region 42b is continuous with the second planar region 42a. The second overlap region 42b overlaps the second connector CP2 in the first direction D1. At least a portion of the second overlap region 42b is disposed between the second connector CP2 and the first planar region 41a (referring to FIG. 2C).

The second side surface region 42s is continuous with the second planar region 42a and the second overlap region 42b. The second side surface region 42s is aligned with the direction in which the first side surface region 41s extends (in the example, the second direction D2).

The second crossing side surface region 42r is continuous with the second planar region 42a and the second overlap region 42b. The second crossing side surface region 42r is aligned with the direction Dr in which the first crossing side surface region 41r extends.

In the second conductive layer 42 as well, for example, the distance between the second side surface region 42s and the second crossing side surface region 42r is longer away from the second overlap region 42b.

For example, as shown in FIG. 1B and FIG. 2B, the second side surface region 42s includes a second side surface extension end portion 42se and a second side surface middle portion 42sm. The second side surface middle portion 42sm is positioned between the second side surface extension end portion 42se and the second overlap region 42b.

The second crossing side surface region 42r includes a second crossing side surface extension end portion 42re and a second crossing side surface middle portion 42rm. The second crossing side surface middle portion 42rm is positioned between the second crossing side surface extension end portion 42re and the second overlap region 42b.

As shown in FIG. 1B and FIG. 2B, a distance de2 between the second side surface extension end portion 42se and the second crossing side surface extension end portion 42re is longer than a distance dm2 between the second side surface middle portion 42sm and the second crossing side surface middle portion 42rm.

In the example as shown in FIG. 2B, at least a portion of the second side surface region 42s is disposed between the first side surface region 41s and the first crossing side surface region 41r. At least a portion of the second crossing side surface region 42r is disposed between the second side surface region 42s and the first crossing side surface region 41r.

Thus, the side surface region and crossing side surface region of the second conductive layer 42 provided on the first conductive layer 41 is disposed between the side surface region and crossing side surface region of the first conductive layer 41. The distance between the two side surface regions of the second conductive layer 42 is narrower than the distance between the two side surface regions of the first conductive layer 41.

The third conductive layer 43 is electrically connected to the third connector CP5. The configuration of the third conductive layer 43 is similar to those of the first conductive layer 41 and the second conductive layer 42.

The third conductive layer 43 includes a third planar region 43a, a third overlap region 43b, a third side surface region 43s, and a third crossing side surface region 43r.

The third planar region 43a spreads along the second planar region 42a. For example, a front surface 43af (e.g., the upper surface) of the third planar region 43a is substantially parallel to the X-Y plane.

At least a portion of the second planar region 42a is disposed between the first planar region 41a and the third planar region 43a. In other words, the second planar region 42a is provided on the first planar region 41a; and the third planar region 43a is provided on the second planar region 42a.

The third overlap region 43b is continuous with the third planar region 43a. The third overlap region 43b overlaps the third connector CP3 in the first direction D1. At least a portion of the third overlap region 43b is disposed between the third connector CPS and the second planar region 42a (referring to FIG. 2D).

The third side surface region 43s is continuous with the third planar region 43a and the third overlap region 43b. The third side surface region 43s is aligned with the direction in which the second side surface region 42s extends (the second direction D2).

The third crossing side surface region 43r is continuous with the third planar region 43a and the third overlap region 43b. The third crossing side surface region 43r is aligned with the direction in which the second crossing side surface region 42r extends (the direction Dr).

In the example as shown in FIG. 2A, at least a portion of the third side surface region 43s is disposed between the second side surface region 42s and the second crossing side surface region 42r. At least a portion of the third crossing side surface region 43r is disposed between the third side surface region 43s and the second crossing side surface region 42r.

For the third conductive layer 43 as well, for example, the distance between the third side surface region 43s and the third crossing side surface region 43r is longer away from the third overlap region 43b. The third side surface region 43s includes a third side surface extension end portion 43se, and a third side surface middle portion 43sm that is positioned between the third side surface extension end portion 43se and the third overlap region 43b. The third crossing side surface region 43r includes a third crossing side surface extension end portion 43re, and a third crossing side surface middle portion 43rm that is positioned between the third crossing side surface extension end portion 43re and the third overlap region 43b. A distance de3 between the third side surface extension end portion 43se and the third crossing side surface extension end portion 43re is longer than a distance dm3 between the third side surface middle portion 43sm and the third crossing side surface middle portion 43rm (referring to FIG. 1B and FIG. 2B).

As shown in FIG. 1A and FIG. 2A, the first insulating region 51 is provided between the first conductive layer 41 and the second conductive layer 42. The second insulating region 52 is provided between the second conductive layer 42 and the third conductive layer 43.

The memory portion MP is connected to the first planar region 41a, the second planar region 42a, and the third planar region 43a.

For example, the first to third conductive layers 41 to 43 are used as multiple word lines of the nonvolatile semiconductor memory device 110. The multiple connectors are provided according to the number of the multiple conductive layers.

In the example of FIG. 1A, the multiple memory portions MP are arranged in the Y-axis direction. The multiple memory portions MP may be arranged two-dimensionally in the Y-axis direction and the X-axis direction. The relationship between the direction in which the memory portions MP are arranged and the direction in which the side surface regions extend is arbitrary. The relationship between the direction in which the memory portions MP are arranged and the direction in which the crossing side surface regions extend is arbitrary.

Memory cells are formed at the regions where the multiple memory portions MP cross the multiple conductive layers. In the nonvolatile semiconductor memory device 110, the memory cells are arranged three-dimensionally.

In the embodiment, the connector is disposed on the overlap region. The overlap region is the region where two side surface regions merge. For example, when viewed from the direction of arrow AA of FIG. 1A, the width of the overlap region is greater than the widths of the side surface regions. A reliable electrical connection is obtained by providing the connector on such an overlap region. The surface area of the region (the connection region of the word line) where the overlap region is formed is relatively small. Thereby, for example, the connection region of the word line can be set to be narrow. Thereby, the memory region can be enlarged. For the same size of chip, the memory capacity can be enlarged because the memory region can be enlarged. According to the embodiment, for example, a nonvolatile semiconductor memory device can be provided in which the connection region can be narrow.

In the embodiment as recited above, for example, the width of the overlap region where the connector is provided is wider than the width of the side surface region.

As shown in FIG. 2B, for example, the width of the first side surface region 41s is a length ws1 of the first side surface region 41s in a direction Dp (in the example, the Y-axis direction) perpendicular to the direction in which the first side surface region 41s extends (the second direction D2, and in the example, the X-axis direction). A length wb1 of the first overlap region 41b in the perpendicular direction Dp is longer than the length ws1.

Similarly, for example, a length wb2 of the second overlap region 42b in the perpendicular direction Dp recited above is longer than a length ws2 of the second side surface region 42s in the perpendicular direction Dp recited above. For example, a length wb3 of the third overlap region 43b in the perpendicular direction Dp recited above is longer than a length ws3 of the third side surface region 43s in the perpendicular direction Dp recited above.

For example, the width of the first crossing side surface region 41r is a length wr1 of the first crossing side surface region 41r in a direction perpendicular to the direction Dr in which the first crossing side surface region 41r extends. The length of the first overlap region 41b in the direction perpendicular to the direction Dr is longer than the length wr1. Similarly, for example, the length of the second overlap region 42b in the direction perpendicular to the direction Dr is longer than the length of the second crossing side surface region 42r in the direction perpendicular to the direction Dr. For example, the length of the third overlap region 43b in the direction perpendicular to the direction Dr is longer than the length of the third crossing side surface region 43r in the direction perpendicular to the direction Dr.

A stable electrical connection is obtained because the connector is provided on an overlap region having such a wide width.

As shown in FIG. 1A and FIG. 1B, the planar region has a layer configuration aligned with the X-Y plane. On the other hand, the side surface region and the crossing side surface region have wall configurations. The overlap region is a region where the side surface region and the crossing side surface region are linked and has a wail configuration or a columnar configuration. The height (the length in the Z-axis direction) of the overlap region is greater than the thickness of the planar region having the layer configuration.

As shown in FIG. 1B, for example, a length h1 along the first direction D1 of the first overlap region 41b is longer than a length t1 (the thickness) along the first direction D1 of the first planar region 41a. A length h2 along the first direction D1 of the second overlap region 42b is longer than a length t2 (the thickness) along the first direction D1 of the second planar region 42a. A length h3 along the first direction D1 of the third overlap region 43b is longer than a length t3 (the thickness) along the first direction D1 of the third planar region 43a.

As described below, the side surface region and the crossing side surface region may be tilted with respect to the Z-axis direction. In such a case, the width of the overlap region may change along the Z-axis direction.

As shown in FIG. 1A, the positions in the Z-axis direction of the upper end portions of the multiple conductive layers are substantially the same.

As shown in FIG. 1B, the heights of the multiple overlap regions decrease in the upward direction. For example, the length h1 (e.g., the height) along the first direction D1 of the first overlap region 41b is longer than the length h2 (e.g., the height) along the first direction D1 of the second overlap region 42b. The length h2 (e.g., the height) along the first direction D1 of the second overlap region 42b is longer than the length h3 (e.g., the height) along the first direction D1 of the third overlap region 43b.

In the embodiment, the multiple conductive layers include, for example, a metal such as tungsten, etc. The multiple conductive layers may include a semiconductor (e.g., polysilicon, etc.) including an impurity. The multiple connectors include, for example, a metal such as Cu, etc. The multiple insulating regions include, for example, at least one of silicon oxide, silicon nitride, silicon oxynitride, aluminum oxide, or the like. The materials recited above are examples; and the embodiment is not limited to these materials.

An example of the memory portion MP will now be described.

As shown in FIG. 2E and FIG. 2F, the memory portion MP includes a semiconductor layer 20 and a memory film MF.

The semiconductor layer 20 extends in the first direction D1. In the example, the semiconductor layer 20 extends in the first direction D1 through a stacked body SB. The semiconductor layer 20 is, for example, a semiconductor pillar. As shown in FIG. 1A, the stacked body SB includes the first planar region 41a, the second planar region 42a, and a portion of the first insulating region 51 between the first planar region 41a and the second planar region 42a. The stacked body SB may further include the third planar region 43a, and a portion of the second insulating region 52 between the second planar region 42a and the third planar region 43a.

As shown in FIG. 2E and FIG. 2F, the memory film MF is provided between the semiconductor layer 20 and the first planar region 41a and between the semiconductor layer 20 and the second planar region 42a. The memory film MF may be further provided between the semiconductor layer 20 and the third planar region 43a.

The memory film MP includes, for example, a charge storage film. The memory film MF may include, for example, a floating gate film (e.g., a conductive film or the like of polysilicon, etc.).

The memory portion MP may include, for example, a first intermediate layer 31, a second intermediate layer 32, and a third intermediate layer 33. These intermediate layers are provided between the semiconductor layer 20 and the planar regions. For example, the second intermediate layer 32 corresponds to the memory film MF. The first intermediate layer 31 is provided between the semiconductor layer 20 and the second intermediate layer 32. The third intermediate layer 33 is provided between the second intermediate layer 32 and the planar regions.

The first intermediate layer 31 is, for example, a tunneling insulating film. The third intermediate layer 33 is, for example, a blocking insulating film. The second intermediate layer 32 is, for example, a charge storage film or a floating gate film.

The semiconductor layer 20 has a tubular configuration in the example as shown in FIG. 2E and FIG. 2F. For example, a core pillar 20c (e.g., an insulating layer) that extends in the first direction D1 through the stacked body SB is provided; and the semiconductor layer 20 is provided around the core pillar 20c. The semiconductor layer 20 may have a columnar configuration (a circular columnar configuration or a flattened circular columnar configuration).

The configuration of the memory portion MP is arbitrary in the embodiment. For example, the semiconductor layer 20 may be provided to oppose the side surface of the stacked body SB; and the memory film MF may be provided between the stacked body SB and the semiconductor layer 20. The memory film MF may include, for example, a variable resistance layer.

An example of a method for manufacturing the nonvolatile semiconductor memory device 110 will now be described.

FIG. 3A to FIG. 3E are schematic views illustrating the method for manufacturing the nonvolatile semiconductor memory device according to the first embodiment.

Figure 3A:
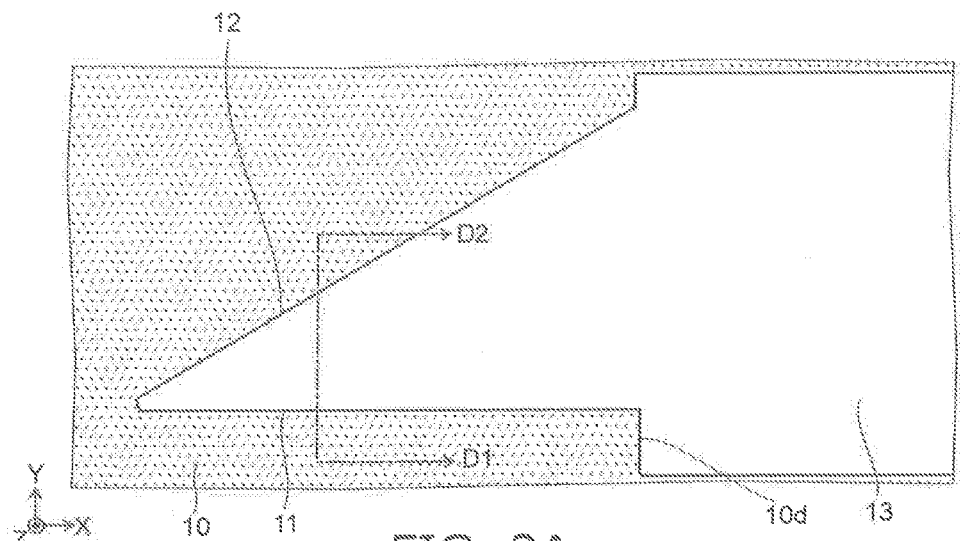
FIG. 3A to FIG. 3E are schematic views illustrating the method for manufacturing the nonvolatile semiconductor memory device according to the first embodiment.

FIG. 3A is a plan view, FIG. 3B to FIG. 3E are line D1-D2 cross-sectional views of FIG. 3A.

Figure 3B:
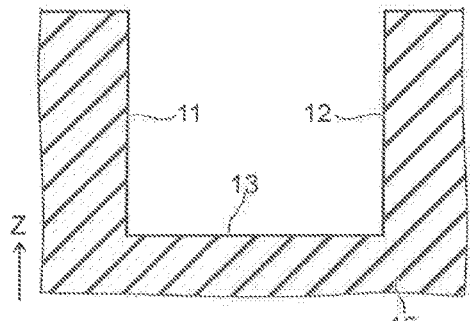

A base body 10 is prepared as shown in FIG. 3A and FIG. 3B. The base body 10 is, for example, a substrate (e.g., a semiconductor substrate) having an insulating film on the front surface of the substrate. The base body 10 has a recess 10d, The recess 10d has a bottom surface 13, a first side surface 11, and a second side surface 12. The distance between the first side surface 11 and the second side surface 12 changes. In the example, the distance between the first side surface 11 and the second side surface 12 increases monotonously along the direction in which the first side surface 11 extends. For example, the direction in which the second side surface 12 extends crosses the direction in which the first side surface 11 extends. For example, the direction in which the second side surface 12 extends is tilted with respect to the direction in which the first side surface 11 extends. The angle between these directions may be, for example, less than 90 degrees.

Figure 3C:
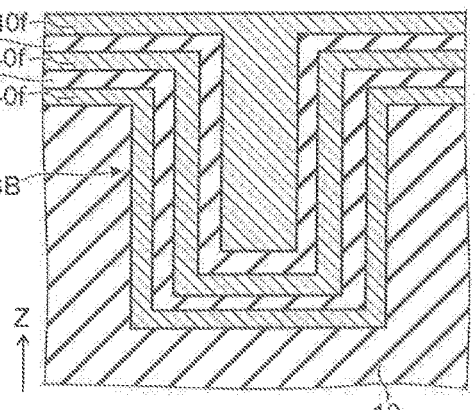

As shown in FIG. 3C, the stacked body SB is formed by alternately stacking a conductive film 40f and an insulating film 50f inside the recess 10d of the base body 10. The stacked body SB includes the multiple conductive films 40f and the multiple insulating films 50f. The stacked body SB is formed on the bottom surface 13, the first side surface 11, and the second side surface 12 of the recess 10d. The stacked body SB is formed also on the portion (the upper surface) of the base body 10 other than the recess 10d. For example, the conductive films 40f are used to form the first to third conductive layers 41 to 43.

Figure 3D:
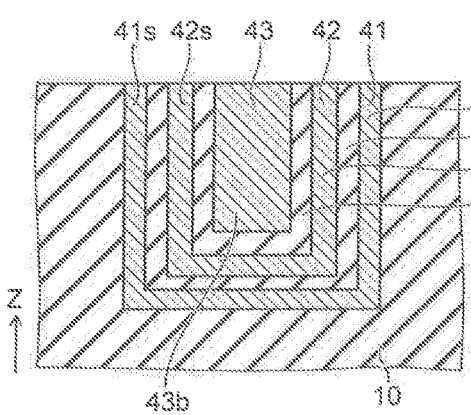

A portion of the stacked body SB is removed as shown in FIG. 3D. Thereby, a portion of the first conductive film which is one of the multiple conductive films, a portion of the second conductive film which is one other of the multiple conductive films, and a portion of the third conductive film which is one other of the multiple conductive films are exposed. For example, etch-back is used to remove the portion of the stacked body SB. For example, CMP (Chemical Mechanical Polishing) may be used in the removal. The first conductive layer 41 is formed from the first conductive film. The second conductive layer 42 is formed from the second conductive film. The third conductive layer 43 is formed from the third conductive film. For example, the first insulating region 51 and the second insulating region 52 are formed from the insulating film 50f.

Figure 3E:
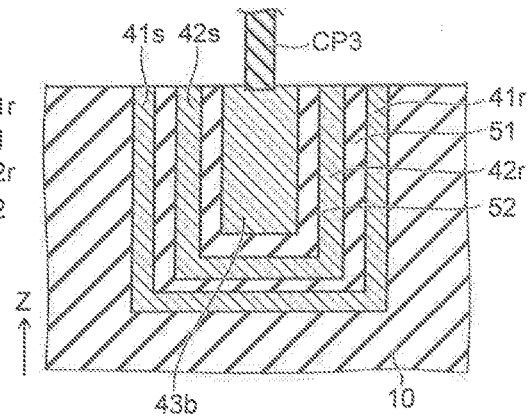

The first to third connectors CP1 to CP3 are formed as shown in FIG. 1A and FIG. 2A. FIG. 3E illustrates a cross section including the third connector CP3.

The first connector CP1 is formed on the first overlap region 41b where the first side surface region 41s of the first conductive layer 41 aligned with the first side surface 11 is linked to the first crossing side surface region 41r of the first conductive layer 41 aligned with the second side surface 12. The first connector CP1 extends in the first direction D1 crossing the bottom surface 13 of the recess 10d of the base body 10. The first connector CP1 is electrically connected to the first overlap region 41b.

The second connector CP2 is formed on the second overlap region 42b where the second side surface region 42s of the second conductive layer 42 aligned with the first side surface 11 is linked to the second crossing side surface region 42r of the second conductive layer 42 aligned with the second side surface 12. The second connector CP2 extends in the first direction D1 and is electrically connected to the second overlap region 42b.

The third connector CP3 is formed on the third overlap region 43b where the third side surface region 43s of the third conductive layer 43 aligned with the first side surface 11 is linked to the third crossing side surface region 43r of the third conductive layer 43 aligned with the second side surface 12. The third connector CP3 extends in the first direction D1 and is electrically connected to the third overlap region 43b.

The portions of the first to third conductive layers 41 to 43 formed on the bottom surface 13 correspond to the first to third planar regions 41a to 43a (the stacked body SB). The memory portion MP is formed in these planar regions. The memory portion MP is connected to the first planar region 41a of the first conductive layer 41 aligned with the bottom surface 13, the second planar region 42a of the second conductive layer 42 aligned with the bottom surface 13, and the third planar region 43a of the third conductive layer 43 aligned with the bottom surface 13. For example, a hole is formed in the stacked body SB; and the memory film MF, the intermediate layers, etc., are formed on the side surface of the hole. Thereby, the memory portion MP is formed. Thus, the nonvolatile semiconductor memory device 110 is formed.

In the manufacturing method, the multiple conductive layers are obtained at one time by forming the stacked body SB on the base body 10 having the recess 10d and by planarizing. The multiple conductive layers are formed so that the width of the overlap region is wider than the side surface region. The wide region can be formed easily. By forming the connector on the overlap region, a good electrical connection is obtained easily. The tolerable design width that considers the positional shift can be reduced. According to the embodiment, a method for manufacturing a nonvolatile semiconductor memory device can be provided in which the connection region can be narrow.

In the manufacturing method recited above, the length wb1 of the first overlap region 41b in the direction Dp that is aligned with the first planar region 41a and is perpendicular to the second direction D2 in which the first side surface region 41s extends is longer than the length ws1 of the first side surface region 41s in the perpendicular direction Dp recited above. The length wb2 of the second overlap region 42b in the perpendicular direction Dp recited above is longer than the length ws2 of the second side surface region 42s in the perpendicular direction Dp recited above (referring to FIG. 2B). Such a configuration is obtained easily.

An example of another method for manufacturing the nonvolatile semiconductor memory device 110 will now be described. The manufacturing method recited below includes, for example, a replacement method.

FIG. 4A to FIG. 4D are schematic views illustrating the other method for manufacturing the nonvolatile semiconductor memory device according to the first embodiment.

Figure 4A:
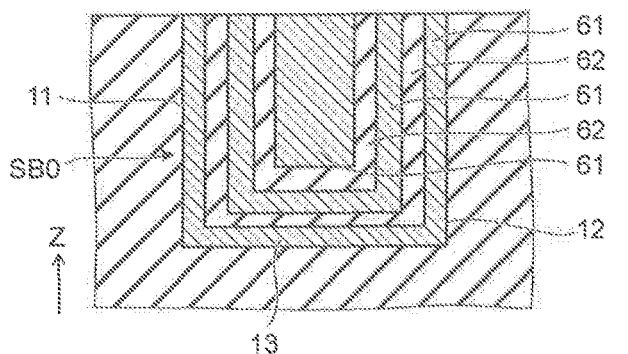
FIG. 4A to FIG. 4D are schematic views illustrating the other method for manufacturing the nonvolatile semiconductor memory device according to the first embodiment.
Figure 4B:
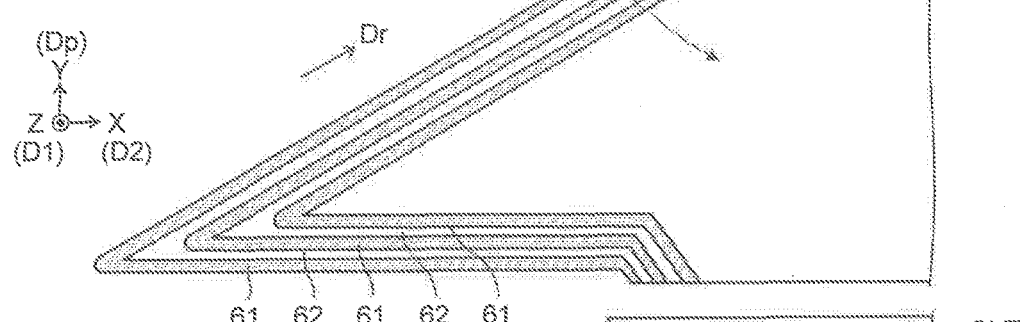
Figure 4C:
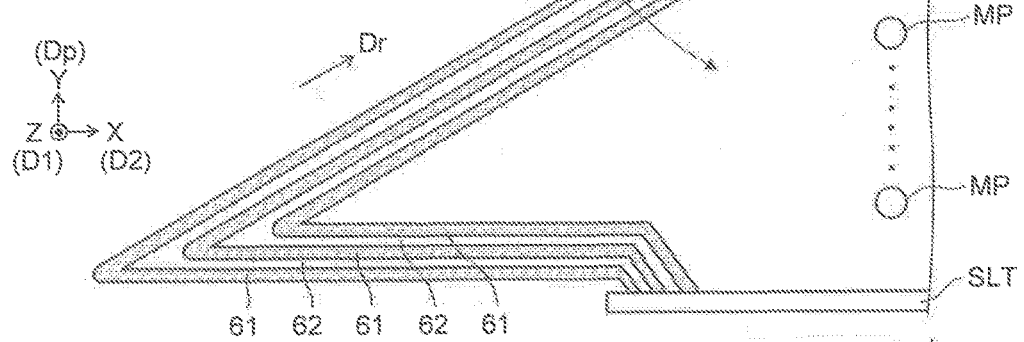
Figure 4D:
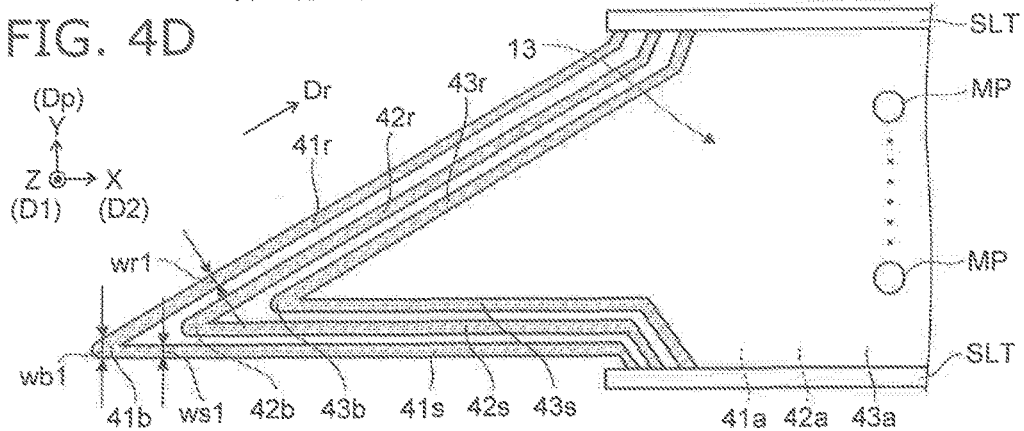

FIG. 4A is a cross-sectional view. FIG. 4B to FIG. 4D are plan views.

The base body 10 described in reference to FIG. 3A is prepared. The base body 10 has the bottom surface 13, the first side surface 11, and the second side surface 12. For example, the distance between the first side surface 11 and the second side surface 12 increases monotonously.

As shown in FIG. 4A, the stacked body SB0 is formed by alternately stacking a first film 61 and a second film 62 inside such a recess 10d of the base body 10. The stacked body SB0 includes the multiple first films 61 and the multiple second films 62. The first film 61 is, for example, a sacrificial layer. The first film 61 includes, for example, silicon nitride; and the second film 62 includes, for example, silicon oxide. A portion of each of the multiple first films 61 is exposed by removing a portion of the stacked body SB0 (FIG. 4A and FIG. 4B).

As shown in FIG. 4C, for example, the memory portion MP is formed in a region including the portions of the multiple first films 61 and the multiple second films 62 aligned with the bottom surface 13. For example, a hole is formed in this region; and the third intermediate layer 33, the second intermediate layer 32 (the memory film MF), the first intermediate layer 31, the semiconductor layer 20, etc., are formed in the hole.

A hole SLT (e.g., a slit) is formed in the stacked body SB0. The multiple first films 61 are removed via the hole SLT; and a conductive material is introduced to the space formed by the removal.

Thereby, as shown in FIG. 4D, multiple conductive layers that include the conductive material are formed. The multiple conductive layers include the first to third conductive layers 41 to 43.

Subsequently, as shown in FIG. 1A and FIG. 2A, the first connector CP1 is formed on the first overlap region 41b where the first side surface region 41s of the first conductive layer 41 aligned with the first side surface 11 is linked to the first crossing side surface region 41r of the first conductive layer 41 aligned with the second side surface 12. The first connector CP1 extends in the first direction D1 crossing the bottom surface 13 and is electrically connected to the first overlap region 41b. Then, the second connector CP2 is formed on the second overlap region where the second side surface region 42s of the second conductive layer 42 aligned with the first side surface 11 is linked to the second crossing side surface region 42r of the second conductive layer 42 aligned with the second side surface 12. The second connector CP2 extends in the first direction D1 and is electrically connected to the second overlap region 42b. Similarly, the third connector CP3 is formed on the third overlap region 43b of the third conductive layer 43.

The memory portion MP recited above is connected to the first planar region 41a of the first conductive layer 41 aligned with the bottom surface 13, the second planar region 42a of the second conductive layer 42 aligned with the bottom surface 13, and the third planar region 43a of the third conductive layer 43 aligned with the bottom surface 13.

Thereby, the nonvolatile semiconductor memory device 110 is formed.

The position and configuration of the hole SLT are arbitrary in such a manufacturing method (a method including a replacement method).

Figure 5A:
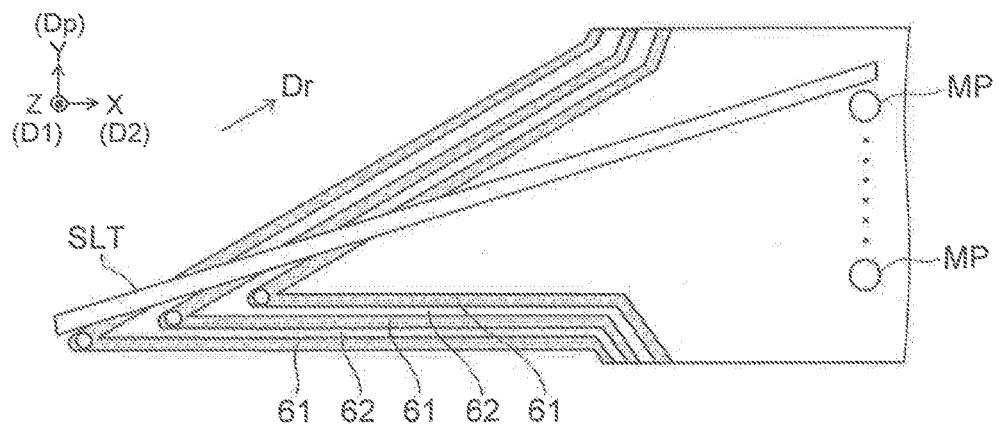
FIG. 5A and FIG. 5B are schematic plan views illustrating another method for manufacturing a nonvolatile semiconductor memory device according to the first embodiment.
Figure 5B:
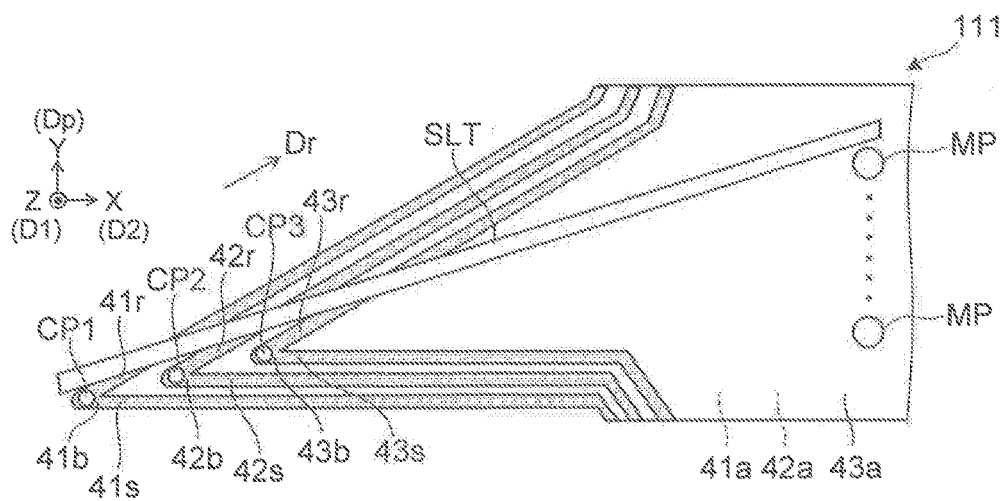

FIG. 5A and FIG. 5B are schematic plan views illustrating another method for manufacturing a nonvolatile semiconductor memory device according to the first embodiment.

As shown in FIG. 5A, the hole SLT (e.g., the silt) is formed in the stacked body SB0 including the multiple first films 61 and the multiple second films 62. In the example, the hole SLT is provided to divide the portions of the conductive layers that are the side surface regions and the portions of the conductive layers that are the crossing side surface regions.

As shown in FIG. 5B, the multiple conductive layers are formed by removing the first films 61 and by introducing a conductive material to the space that is formed. Also, the connectors are formed. Thereby, the nonvolatile semiconductor memory device 111 is formed.

The length of the crossing side surface region (e.g., the first crossing side surface region 41r) of the nonvolatile semiconductor memory device 111 is shorter than the length of the crossing side surface region (e.g., the first crossing side surface region 41r) of the nonvolatile semiconductor memory device 110. The hole SLT may be provided in a portion of the crossing side surface region of the nonvolatile semiconductor memory device 111. In such a case, the length of the side surface region is shorter. Even in the case where the side surface region or the crossing side surface region is short, the two regions that extend from the overlap region exist. The two regions that extend from the overlap region correspond to the side surface region and the crossing side surface region.

Figure 6:
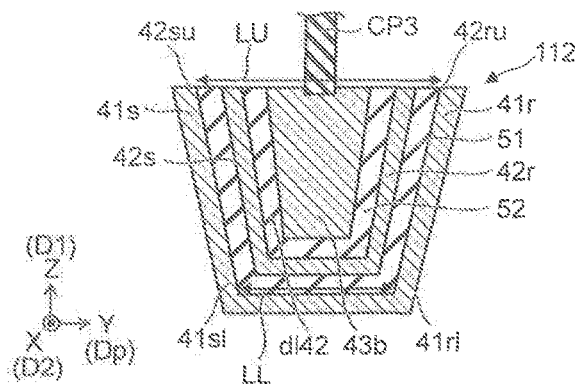
FIG. 6 is a schematic cross-sectional view illustrating another nonvolatile semiconductor memory device according to the first embodiment.

FIG. 6 is a schematic cross-sectional view illustrating another nonvolatile semiconductor memory device according to the first embodiment.

FIG. 6 is a schematic cross-sectional view corresponding to FIG. 2D.

As shown in FIG. 6, the first to third conductive layers 41 to 43 are provided in the nonvolatile semiconductor memory device 112 according to the embodiment as well. In the nonvolatile semiconductor memory device 112, the side surfaces of these conductive layers are tilted. Otherwise, the nonvolatile semiconductor memory device 112 is similar to the nonvolatile semiconductor memory device 110; and a description is therefore omitted.

In the nonvolatile semiconductor memory device 112, at least a portion of the first side surface region 41s is tilted with respect to the first direction D1. At least a portion of the first crossing side surface region 41r is tilted with respect to the first direction D1. For example, the first side surface region 41s has an upper end 41su and a lower end 41l. The lower end 41sl is provided between the upper end 41su and the first planar region 41a. The first crossing side surface region 41r has an upper end 41ru and a lower end 41rl. The lower end 41rl is provided between the upper end 41ru and the first planar region 41a. A distance LU between the upper end 41su and the upper end 41ru is longer than a distance LL between the lower end 41sl and the lower end 41rl. In other words, the first side surface region 41s and the first crossing side surface region 41r spread upward.

Similarly, at least a portion of the second side surface region 42s and at least a portion of the second crossing side surface region 42r also may be tilted with respect to the first direction D1. At least a portion of the third side surface region 43s and at least a portion of the third crossing side surface region 43r also may be tilted with respect to the first direction D1.

The width of the overlap region can be wider easily in such a configuration. Thereby, a reliable electrical connection is obtained easily.

Second Embodiment

Figure 7:
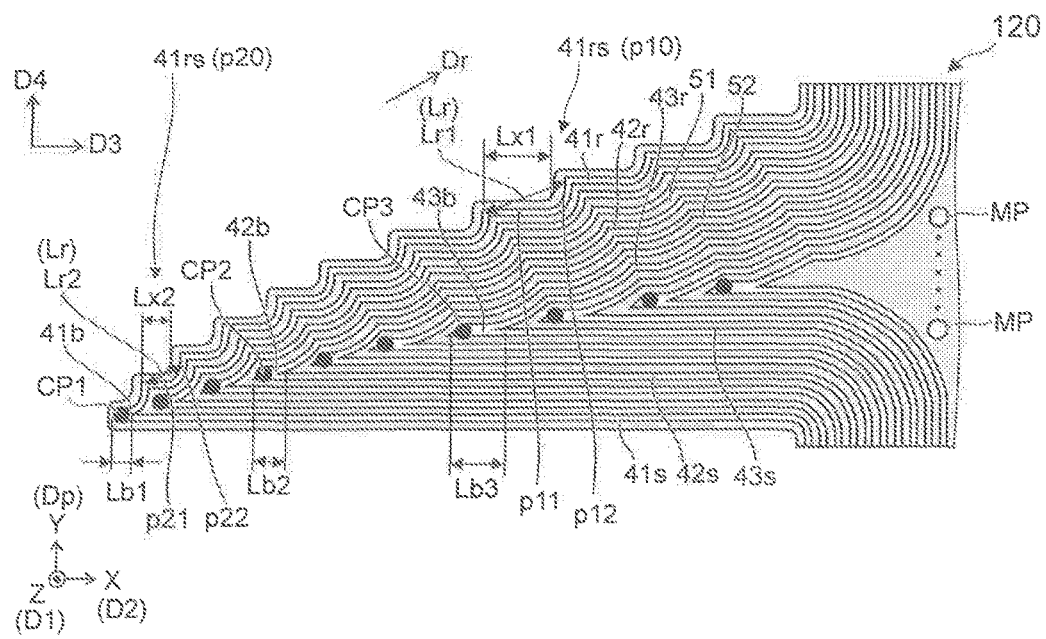
FIG. 7 is a schematic plan view illustrating a nonvolatile semiconductor memory device according to a second embodiment.

FIG. 7 is a schematic plan view illustrating a nonvolatile semiconductor memory device according to a second embodiment.

As shown in FIG. 7, the multiple connectors (the first to third connectors CP1 to CP3, etc.), the multiple conductive layers (the first to third conductive layers 41 to 43, etc.), the insulating regions (the first insulating region 51, the second insulating region, etc.), and the memory portion MP are provided in the nonvolatile semiconductor memory device 120 according to the embodiment as well. In the example as shown in FIG. 7, the number of the multiple conductive layers is ten. The number of conductive layers is arbitrary. Other conductive layers may be provided between the first conductive layer 41 and the second conductive layer 42. Other conductive layers may be provided between the second conductive layer 42 and the third conductive layer 43.

The crossing side surface regions have step configurations in the nonvolatile semiconductor memory device 120. Otherwise, the nonvolatile semiconductor memory device 120 is similar to the nonvolatile semiconductor memory device 110; and a description is therefore omitted.

In the nonvolatile semiconductor memory device 120, the first crossing side surface region 41r of the first conductive layer 41 includes multiple step portions 41rs. The multiple step portions 41rs are arranged in the direction in which the first crossing side surface region 41r extends (the direction Dr). Lengths Lr along the direction Dr of the multiple step portions 41rs are longer away from the first overlap region 41b. For example, a length Lr1 of the portion distal to the first overlap region 41b recited above is longer than a length Lr2 of the portion proximal to the first overlap region 41b recited above.

For example, the first crossing side surface region 41r includes a first portion p10 and a second portion p20. The second portion p20 is provided between the first portion p10 and the first overlap region 41b.

The first portion p10 includes a first partial region p11 and a first crossing partial region p12. The first partial region is aligned with a third direction D3 that is aligned with the first planar region. The first crossing partial region p12 is connected to the first partial region p11 and is aligned with a direction (a fourth direction D4) crossing the third direction D3.

The second portion p20 includes a second partial region p21 and a second crossing partial region p22. The second partial region p21 is aligned with the third direction D3. The second crossing partial region p22 is connected to the second partial region p21 and is aligned with a direction (e.g., the fourth direction D4) crossing the third direction D3.

A length Lx1 in the third direction D3 of the first partial region p11 is longer than a length Lx2 in the third direction D3 of the second partial region p21.

By setting the lengths of the multiple step portions 41rs to be longer away from the first overlap region 41b, the side surface region and the crossing side surface region are united easily for the conductive layer (e.g., the third conductive layer 43) of the multiple conductive layers positioned on the upper side. Thereby, the width (e.g., the width along the X-axis direction) of the overlap region is reduced easily.

In the embodiment, for example, the widths (the lengths in the X-axis direction) of the multiple overlap regions may be different from each other. For example, the first side surface region 41s extends along the second direction D2 (the direction aligned with the first planar region, i.e., the X-axis direction). A length Lb1 in the second direction D2 of the first overlap region 41b is shorter than a length Lb2 in the second direction D2 of the second overlap region 42b. The length Lb2 in the second direction D2 of the second overlap region 42b is shorter than a length Lb3 in the second direction D2 of the third overlap region 43b.

An example of a method for manufacturing the nonvolatile semiconductor memory device 120 will now be described.

FIG. 8A to FIG. 8D, FIG. 9A, and FIG. 9B are schematic views illustrating the method for manufacturing the nonvolatile semiconductor memory device according to the second embodiment.

Figure 8A:
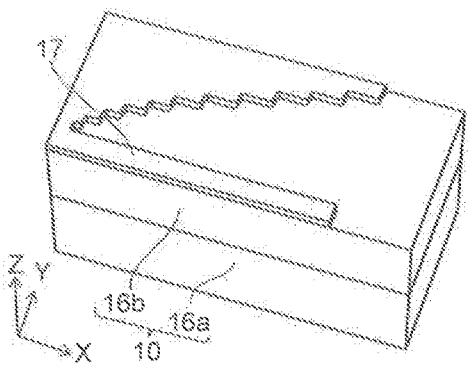
FIG. 8A to FIG. 8D are schematic views illustrating the method for manufacturing the nonvolatile semiconductor memory device according to the second embodiment.

As shown in FIG. 8A, a patterning film 16b is provided on a substrate 16a. The substrate 16a and a portion of the patterning film 16b are used to form the base body 10. A mask 17 that has a prescribed configuration is formed on the patterning film 16b. A portion of the patterning film 16b is removed by using the mask 17 as a mask.

Figure 8B:
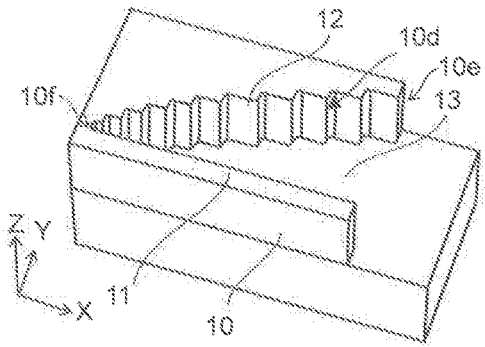

Thereby, as shown in FIG. 8B, the base body 10 that has the recess 10d is formed. The recess 10d has the bottom surface 13, the first side surface 11, and the second side surface 12. In the example, the second side surface 12 has a step configuration; and the distance between the first side surface 11 and the second side surface 12 changes in the step configuration. In the example, one end 10e of the recess 10d is open. On the other hand, the other end 10f of the recess 10d is closed.

Figure 8C:
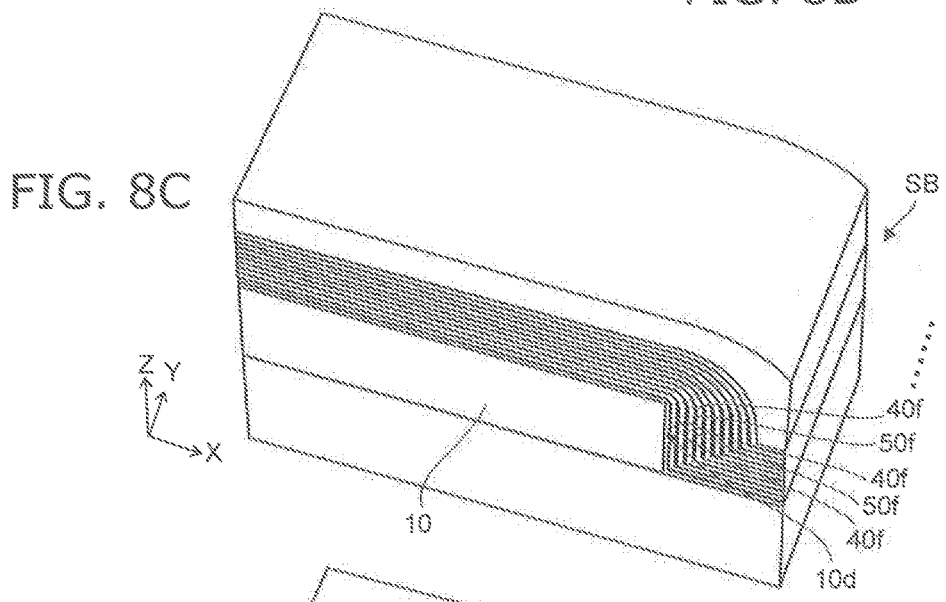

As shown in FIG. 8C, the stacked body SB is formed by alternately stacking the conductive films 40f and the insulating films 50f.

Figure 8D:
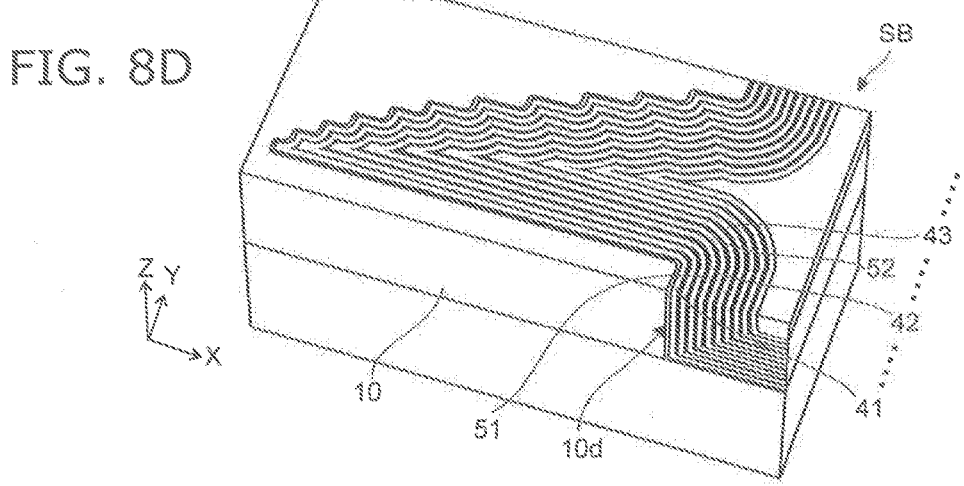
Figure 9A:
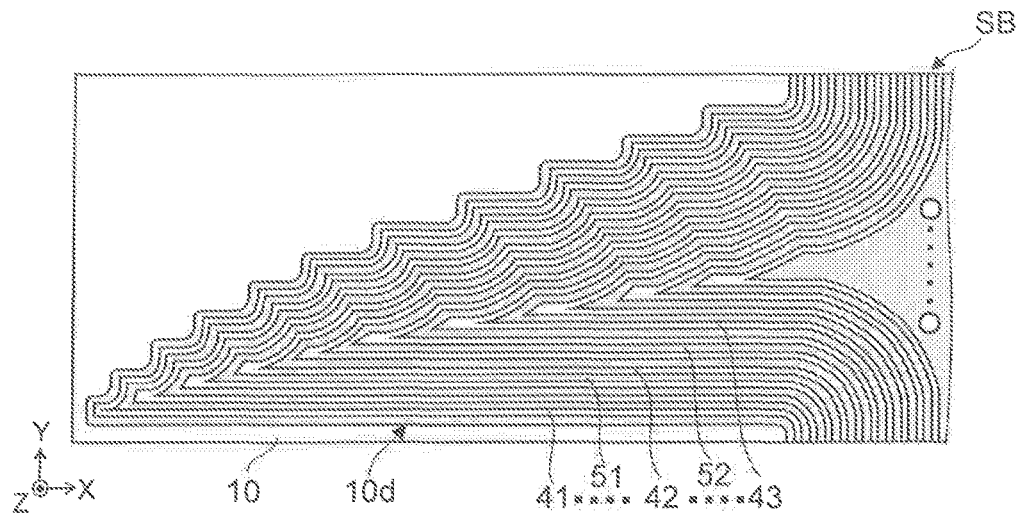
FIG. 9A and FIG. 9B are schematic views illustrating the method for manufacturing the nonvolatile semiconductor memory device according to the second embodiment.

A portion of the stacked body SB is removed as shown in FIG. 8D and FIG. 9A. For example, etch-back or CMP is used. Thereby, the multiple conductive layers (the first to third conductive layers 41 to 43) and the insulating regions (the first insulating region 51, the second insulating region 52, etc.) are formed.

Figure 9B:
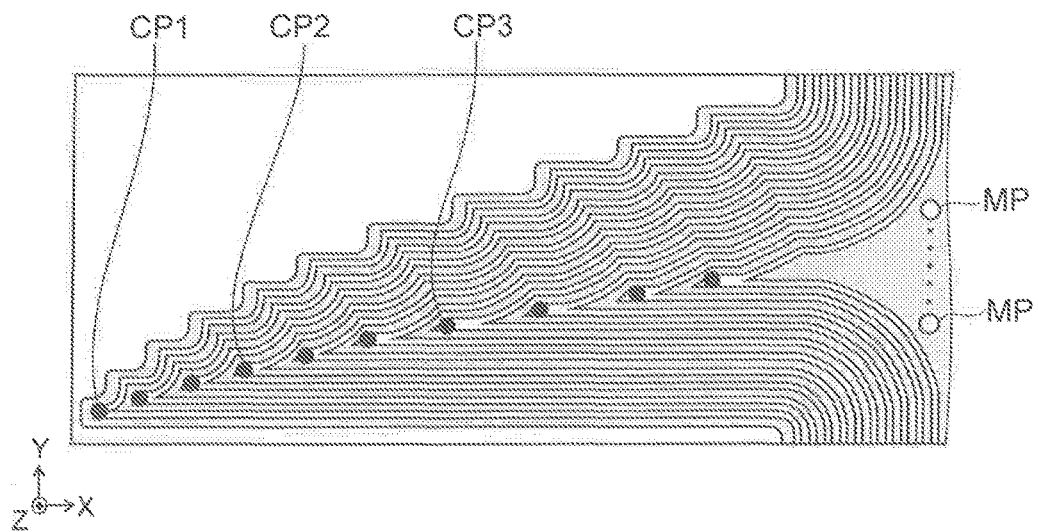

As shown in FIG. 9B, the connectors (the first to third connectors CP1 to CP3, etc.) and the memory portion MP are formed.

Thereby, the nonvolatile semiconductor memory device 120 is made. The nonvolatile semiconductor memory device 120 may be formed by a method including the replacement method described above.

FIG. 10A to FIG. 10F are schematic plan views illustrating other nonvolatile semiconductor memory devices according to the second embodiment.

Figure 10A:
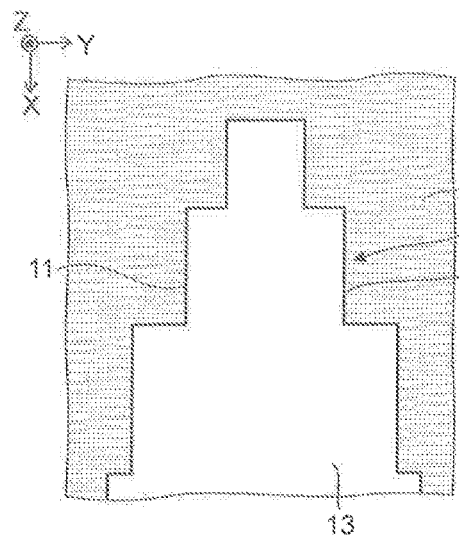
FIG. 10A to FIG. 10F are schematic plan views illustrating other nonvolatile semiconductor memory devices according to the second embodiment.

As shown in FIG. 10A, both the first side surface 11 and the second side surface 12 of the recess 10d of the base body 10 have step configurations. The lengths in the X-axis direction and the lengths in the Y-axis direction are set appropriately for the multiple steps.

Figure 10B:
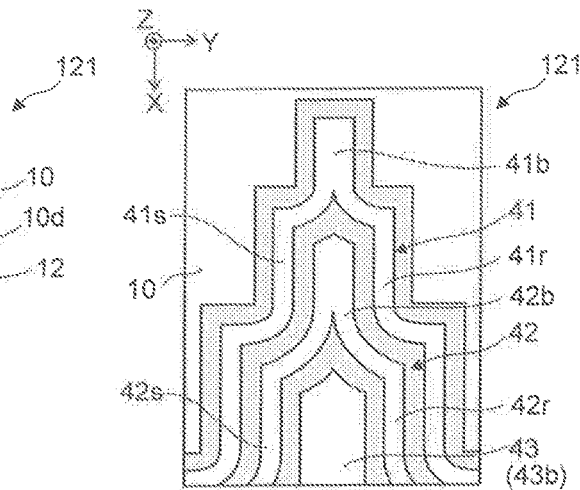

A nonvolatile semiconductor memory device 121 shown in FIG. 10B is formed using the base body 10 illustrated in FIG. 10A. In the nonvolatile semiconductor memory device 121, step portions are provided in the side surface region and the crossing side surface region.

Figure 10C:
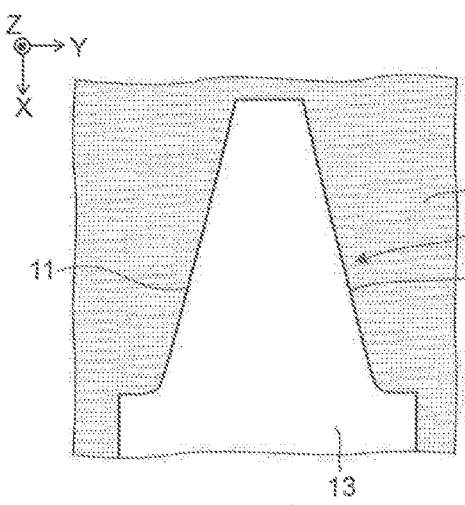

As shown in FIG. 10C, the distance between the first side surface 11 and the second side surface 12 of the recess 10d of the base body 10 spreads continuously.

Figure 10D:
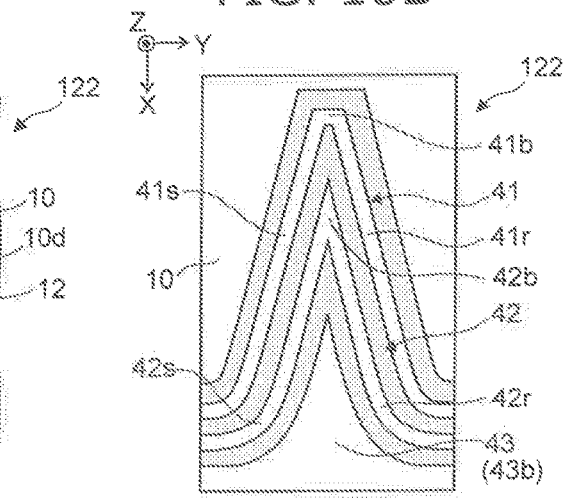

A nonvolatile semiconductor memory device 122 shown in FIG. 10D is formed using the base body 10 illustrated in FIG. 10C. In the nonvolatile semiconductor memory device 122, the distance between the side surface region and the crossing side surface region changes continuously.

Figure 10E:
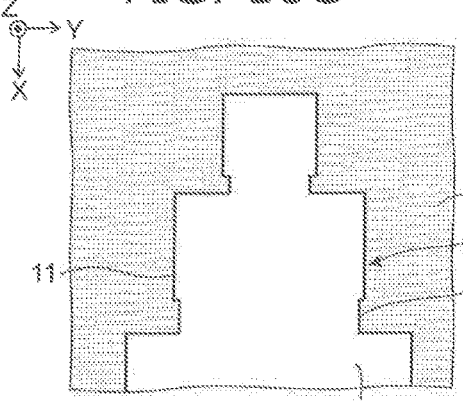

As shown in FIG. 10E, the distance between the first side surface 11 and the second side surface 12 of the recess 10d of the base body 10 increases as an entirety along one direction (the X-axis direction). The distance has an increase-decrease portion that is repeated. The width of one increase-decrease portion of the distance is, for example, not more than about one thickness of the conductive layer. Thus, the distance between the first side surface 11 and the second side surface 12 may increase and decrease along the direction in which the first side surface 11 extends.

Figure 10F:
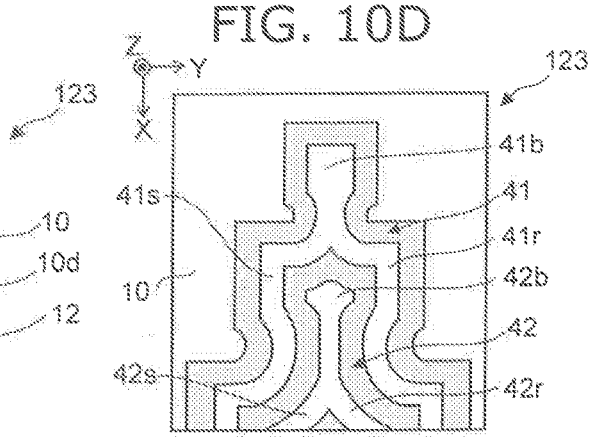

A nonvolatile semiconductor memory device 123 shown in FIG. 10F is formed using the base body 10 illustrated in FIG. 10E. In the nonvolatile semiconductor memory device 123, the distance between the side surface region and the crossing side surface region is increased while repeating the increase-decrease portions. By such a configuration, for example, a portion is formed where the distance between the side surface region and the crossing side surface region becomes short. Thereby, the insulating film 50f does not easily enter the trenches when forming the stacked body SB. Thereby, the overlap region can be formed easily. Thereby, the size of the overlap region can be increased more easily.

For example, the base body 10 that has the recess 10d (e.g., a trench) is used in the embodiments recited above. For example, one end of the recess 10d is open; and the other end of the recess 10d is closed. The width of the recess 10d becomes shorter from the open portion toward the inner portion of the recess 10d. For example, conductive films and insulating films are multiply deposited alternately on such a base body 10. The conductive films and the insulating films that are deposited on the upper surface of the base body 10 are removed. Thereby, the upper surfaces of the multiple conductive films are exposed. Each of the multiple conductive films is formed to have a region where the width of a portion of the conductive film is larger than the other portions. A connection unit (a contact electrode) is formed on such a region (the overlap region). The configuration of the recess 10d may include, for example, a portion having a stairstep configuration. In the portion having the stairstep configuration, multiple regions that are parallel to each other are provided. The multiple regions are arranged to be linked in order of narrowing widths of the multiple regions. For example, a portion where the width has become narrow may be provided in a portion of each step included in the stairsteps.

According to the embodiments, it is possible to form the connection units simultaneously with forming the word lines. The connection units of the multiple word lines can be formed to have small surface areas.

According to the embodiments, a nonvolatile semiconductor memory device and a method for manufacturing the nonvolatile semiconductor memory device can be provided in which the connection region can be narrow.

In this specification, "perpendicular" and "parallel" include not only strictly perpendicular and strictly parallel but also, for example, the fluctuation due to manufacturing processes, etc.; and it is sufficient to be substantially perpendicular and substantially parallel.

Hereinabove, embodiments of the invention are described with reference to specific examples. However; the embodiments of the invention are not limited to these specific examples. For example, one skilled in the art may similarly practice the invention by appropriately selecting specific configurations of components included in the nonvolatile semiconductor memory device such as the connector, the conductive layer, the insulating region, the memory portion, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all nonvolatile semiconductor memory devices and methods for manufacturing the same practicable by an appropriate design modification by one skilled in the art based on the nonvolatile semiconductor memory device and methods for manufacturing the same described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the invention. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile semiconductor memory device, comprising:
   a first connector extending in a first direction;
   a first conductive layer electrically connected to the first connector, the first conductive layer including
      a first planar region spreading to cross the first direction,
      a first overlap region overlapping the first connector in the first direction and being continuous with the first planar region,
      a first side surface region extending along the first planar region and being continuous with the first planar region and the first overlap region, the first side surface region including a first side surface extension end portion and a first side surface middle portion, the first side surface middle portion being positioned between the first side surface extension end portion and the first overlap region, and
      a first crossing side surface region extending along the first planar region and being continuous with the first planar region and the first overlap region, the first crossing side surface region including a first crossing side surface extension end portion and a first crossing side surface middle portion, the first crossing side surface middle portion being positioned between the first crossing side surface extension end portion and the first overlap region,
      wherein a distance between the first side surface extension end portion and the first crossing side surface extension end portion is longer than a distance between the first side surface middle portion and the first crossing side surface middle portion;
   a second connector extending in the first direction;
   a second conductive layer electrically connected to the second connector, the second conductive layer including
      a second planar region spreading along the first planar region,
      a second overlap region overlapping the second connector in the first direction and being continuous with the second planar region, at least a portion of the second overlap region being disposed between the second connector and the first planar region,
      a second side surface region continuous with the second planar region and the second overlap region and aligned with an extension direction of the first side surface region, the second side surface region including a second side surface extension end portion and a second side surface middle portion, the second side surface middle portion being positioned between the second side surface extension end portion and the second overlap region, and
      a second crossing side surface region continuous with the second planar region and the second overlap region and aligned with an extension direction of the first crossing side surface region, the second crossing side surface region including a second crossing side surface extension end portion and a second crossing side surface middle portion, the second crossing side surface middle portion being positioned between the second crossing side surface extension end portion and the second overlap region,
      wherein a distance between the second side surface extension end portion and the second crossing sloe surface extension end portion is longer than a distance between the second side surface middle portion and the second crossing side surface middle portion;
   a first insulating region provided between the first conductive layer and the second conductive layer; and
   a memory portion connected to the first planar region and the second planar region.

2. The device according to claim 1, wherein a length along the first direction of the first overlap region is longer than a length along the first direction of the first planar region.

3. The device according to claim 2, wherein the length along the first direction of the first overlap region is longer than a length along the first direction of the second overlap region.

4. The device according to claim 1, further comprising:
   a third connector extending in the first direction;
   a third conductive layer electrically connected to the third connector, the third conductive layer including
      a third planar region spreading along the second planar region, at least a portion of the second planar region being disposed between the first planar region and the third planar region,
      a third overlap region overlapping the third connector in the first direction and being continuous with the third planar region, at least a portion of the third overlap region being disposed between the third connector and the second planar region,
      a third side surface region continuous with the third planar region and the third overlap region and aligned with an extension direction of the second side surface region, the third side surface region including a third side surface extension end portion and a third side surface middle portion, the third side surface middle portion being positioned between the third side surface extension end portion and the third overlap region, and a third crossing side surface region continuous with the third planar region and the third overlap region and aligned with an extension direction of the second crossing side surface region, the third crossing side surface region including a third crossing side surface extension end portion and a third crossing side surface middle portion, the third crossing side surface middle portion being positioned between the third crossing side surface extension end portion and the third overlap region, wherein a distance between the third side surface extension end portion and the third crossing side surface extension end portion is longer than a distance between the third side surface middle portion and the third crossing side surface middle portion; and a second insulating region provided between the second conductive layer and the third conductive layer, the memory portion being further connected to the third planar region.

5. The device according to claim 4, wherein
a length of the first overlap region in a perpendicular direction is longer than a length of the first side surface region in the perpendicular direction, the perpendicular being perpendicular to the extension direction of the first side surface region and aligned with the first planar region, a length of the second overlap region in the perpendicular direction is longer than a length of the second side surface region in the perpendicular direction, and a length of the third overlap region in the perpendicular direction is longer than a length of the third side surface region in the perpendicular direction.

6. The device according to claim 4, wherein
at least a portion of the third side surface region is disposed between the second side surface region and the second crossing side surface region, at least a portion of the third crossing side surface region is disposed between the third side surface region and the second crossing side surface region, at least a portion of the second side surface region is disposed between the first side surface region and the first crossing side surface region, and at least a portion of the second crossing side surface region is disposed between the second side surface region and the first crossing side surface region.

7. The device according to claim 4, wherein
the first side surface region extends along a second direction, the second direction being aligned with the first planar region, a length in the second direction of the first overlap region is shorter than a length in the second direction of the second overlap region, and the length in the second direction of the second overlap region is shorter than a length in the second direction of the third overlap region.

8. The device according to claim 1, wherein
the first crossing side surface region includes a first portion and a second portion, the second portion being provided between the first portion and the first overlap region, the first portion includes:
a first partial region aligned with a third direction, the third direction being aligned with the first planar region; and
a first crossing partial region connected to the first partial region and aligned with a direction crossing the third direction, the second portion includes:
a second partial region aligned with the third direction; and
a second crossing partial region connected to the second partial region and aligned with the direction crossing the third direction, and a length in the third direction of the first partial region is longer than a length in the third direction of the second partial region.

9. The device according to claim if wherein
the first crossing side surface region includes a plurality of step portions arranged in the extension direction of the first crossing side surface region, and lengths of the plurality of step portions in the extension direction of the first crossing side surface region are longer away from the first overlap region.

10. The device according to claim 1, wherein
at least a portion of the first side surface region is tilted with respect to the first direction, and at least a portion of the first crossing side surface region is tilted with respect to the first direction.

11. The device according to claim 1, wherein
the memory portion includes:
a semiconductor layer extending in the first direction; and
a memory film provided between the semiconductor layer and the first planar region and between the semiconductor layer and the second planar region.

12. The device according to claim 1, wherein an angle between the extension direction of the first side surface region and the extension direction of the first crossing side surface region is less than 90 degrees.

* * * * *